US005353199A

United States Patent [19]

Ohashi

[11] Patent Number: 5,353,199

[45] Date of Patent: Oct. 4, 1994

[54] METHOD OF MOUNTING A FUSE HOLDING CLIP FOR A FUSE HOLDER AND A FUSE HOLDING CLIP THEREFOR

[75] Inventor: Kozi Ohashi, Asaka, Japan

[73] Assignee: Kyoshin Kogyo Co., Ltd., Japan

[21] Appl. No.: 33,496

[22] Filed: Mar. 18, 1993

[30] Foreign Application Priority Data

Mar. 25, 1992 [JP] Japan .................................. 4-097454

[51] Int. Cl.[5] ............................................... H05K 7/02

[52] U.S. Cl. .................................... 361/809; 361/773; 361/837; 361/760; 439/893

[58] Field of Search ............... 361/380, 349, 360, 400, 361/465, 417, 419, 420, 430, 431, 432, 837, 833, 773, 760, 807, 809, 813; 439/893, 884; 248/624, 626, 227, 231.8

[56] References Cited

U.S. PATENT DOCUMENTS

| | | | |
|---|---|---|---|
| 4,196,959 | 4/1980 | Chesemore et al. | 339/258 P |
| 4,367,910 | 1/1983 | Seidler | 339/275 B |
| 4,592,617 | 6/1986 | Seidler | 339/275 B |

*Primary Examiner*—Gerald P. Tolin
*Assistant Examiner*—Young Whang
*Attorney, Agent, or Firm*—Pearne, Gordon, McCoy & Granger

[57] ABSTRACT

A method of mounting fuse holding clips for a fuse holder on a circuit board by such an automatic part inserter as is used for inserting radial parts and including a pusher having a lower dead point set at 5 to 20 mm upwardly distant from an upper face of the circuit board and comprising a step of inserting a fuse holding clip while the pusher of the automatic inserter is engaging narrowed faces of a clip body which are to support a lower portion of a fuse until a bottom of the fuse holding clip is engaged with the upper face of the circuit board.

5 Claims, 9 Drawing Sheets

METHOD OF MOUNTING A FUSE HOLDING CLIP FOR A FUSE HOLDER AND A FUSE HOLDING CLIP THEREFOR

BACKGROUND OF THE INVENTION

This invention relates to a method of mounting fuse holding clips for a fuse holder on a circuit board and more particularly an improvement on a method of mounting fuse holding clips by an automatic part inserter after they are cut away from a lead frame including a plurality of fuse holding clips having mounting legs to extend through mounting holes in the circuit board and to be securely mounted on the circuit board by a soldering layer.

In general, there has been used an autoamtic part inserting machine which mechanically and continuously inserts a plurality of fuse holding clips at their mounting legs in mounting holes in a circuit board.

There has been also used an assembly of fuse holding clips to be mounted on the circuit board by such an automatic part inserting machine. Such an assembly of fuse holding clips may be referred to as taped clips and comprises a lead frame having a perforation engaging feeding pawls of a sprocket of the automatic part inserter with the fuse holding clips at their mounting legs integrally provided with the lead frame in a spaced manner.

As shown in FIGS. 12 and 13, each of the fuse holding clips 12 comprises a resiliently fuse holding clip body 18 including mounting legs 22 integrally provided therewith. The clip body 18 comprises a generally U-shaped curved piece 20 for resiliently holding one of bases of a fuse such as a cartridge fuse and an upper base receiving opening 24 provided at the end of the curved piece 20 and widened toward its upper edges as shown in FIGS. 12 and 13.

The automatic part inserting machine feeds the taped clips to a clip mounting position by rotation of its sprocket and removes the respective fuse holding clips at their mounting legs out of the taped clips by holding them by means of a chuck of the machine and cutting them by means of a cutter thereof.

Thereafter, the machine pushes down the respective fuse holding clips by a pusher 42 of the machine which engages the generally U-shaped curved piece 20 of the resiliently fuse holding clip 12 at its inner bottom while inserting the mounting legs 22 of the fuse holding clips 12 into the mounting holes in the circuit board until an outer bottom **20*b* of the U-shaped curved piece 20** engages the upper face of the circuit board.

Finally, the mounting legs of the fuse holding clip are clinched by a clincher of the machine so that they are bent along an underside side of the circuit board toward an electrically conducting layer thereon and soldered thereto so that they are electrically and mechanically connected to the electrically conducting layer.

In a conventional manner, the automatic part inserter for inserting a large-sized radial parts into a circuit board has been also used for inserting the fuse holding clips 12 into the circuit board. Thus, the automatic part inserting machine comprises the pusher 42 having a lower dead point set at 5 to 20 mm distant from an upper face of the circuit board where such large-sized radial parts are most suitably inserted into the circuit board.

However, such a lower dead point of the pusher 42 is too high for the fuse holding clips 12 to be inserted into the circuit board because the pusher 42 of the automatic part inserter engaging the inner bottom **20*a* of the U-shaped curved piece 20 of the fuse holding clip 12 cannot be lowered until the outer bottom 20*b* of the U-shaped curved piece 20 reaches the upper face of the circuit board as shown in FIG. 12**.

Thus, it is required that the fuse holding clips are so designed that the pusher 42 of the inserter can engage the fuse holding clips at their position as high as possible. For example, it is required that the upper edges **24*a* defining the upper base receiving opening 24 of the fuse holding clip 12 for receiving the base of the fuse is so narrowly spaced that, the pusher 42 of the inserter can engage the edges 24*a* of the upper base receiving opening 24 as shwon in FIG. 13**.

However, the fuse holding clips 12 having the thus narrowed upper base receiving opening 24 as shwon in FIG. 13 are not suitable for receiving such fuses as having bases of relatively larger outer diameter. Furthermore, the fuse having the bases of relatively larger outer diameter should be inserted through the narrowed upper receiving opening 24 of the fuse holding clip 12 by a relatively higher inserting force, which causes the fuse to be disadvantageously damaged.

SUMMARY OF THE INVENTION

Accordingly, it is a principal object of the invention to provide a method of mounting a fuse holding clip adapted to insert mounting legs of the fuse holding clip into mounting holes in a circuit board more easily by a pusher of an automatic part inserter while the fuse holding clip has an upper base receiving opening enough wide to more easily place a fuse of relatively larger outer diameter into the fuse holding clip.

It is another object of the invention to provide a fuse holding clip suitably used for a circuit board by more easily inserting mounting legs of the fuse holding clips into mounting holes in the circuit board by a pusher of an automatic part inserting machine while the fuse holding clip has an upper base receiving opening of relatively larger outer diameter.

In accordance with one aspect of the present invention, there is provided a method of mounting a fuse holding clip on a circuit board by an automatic inserting machine, said fuse holding clip comprising a fuse holding clip body including a generally U-shaped curved piece and mounting legs integrally provided with said curved piece to extend through mounting holes in said circuit board, said method characterized by comprising the steps of engaging a pusher of said automatic part inserting machine onto pusher engaging means provided on faces of said clip body which is to support a lower portion of said fuse to be held by said fuse holding clip and pushing down said pusher until an outer bottom of said curved piece engages an upper face of the circuit board.

In accordance with another aspect of the invention, there is provided a fuse holding clip comprising a resiliently fuse holding clip body including a generally U-shaped curved piece and mounting legs integrally provided with said curved piece to extend through mounting holes in a circuit board, said fuse holding clip characterized by comprising pusher engaging means provided on faces of said clip body which is to support a lower portion of said fuse to be held by said fuse holding clip so that a pusher of an automatic part inserting machine engages said pusher engaging means for pushing down said mounting legs so as to extend through said mounting holes.

The fuse holding clips may be provided in the form of tape-like assembly and the automatic part inserting machine inserts the fuse holding clips into the mounting holes in the circuit board by the pusher of the automatic part inserting machine after they are cut away from the tape-like clip assembly by a cutter thereof.

With such pusher engaging means provided on faces of the clip body which are to support the lower portion of the fuse so as to engage the pusher of the automatic part inserting machine, the mounting legs of the fuse holding clip can be more easily inserted into the mouting holes in the circuit board until the outer bottom of the fuse holding clip engages the upper face of the circuit board.

Thus, the upper base receiving opening may have such a size as allowed to more easily place the bases of the fuse having a relatively larger outer diameter into the fuse clip through the upper base receiving opening.

BRIEF DESCRIPTION OF THE DRAWINGS

The above and other objects and features of the invention will be apparent from the description of the embodiment of the invention taken along with the accompanying drawings in which.

DETAILED DESCRIPTION OF THE EMBODIMENT

Figure 1:
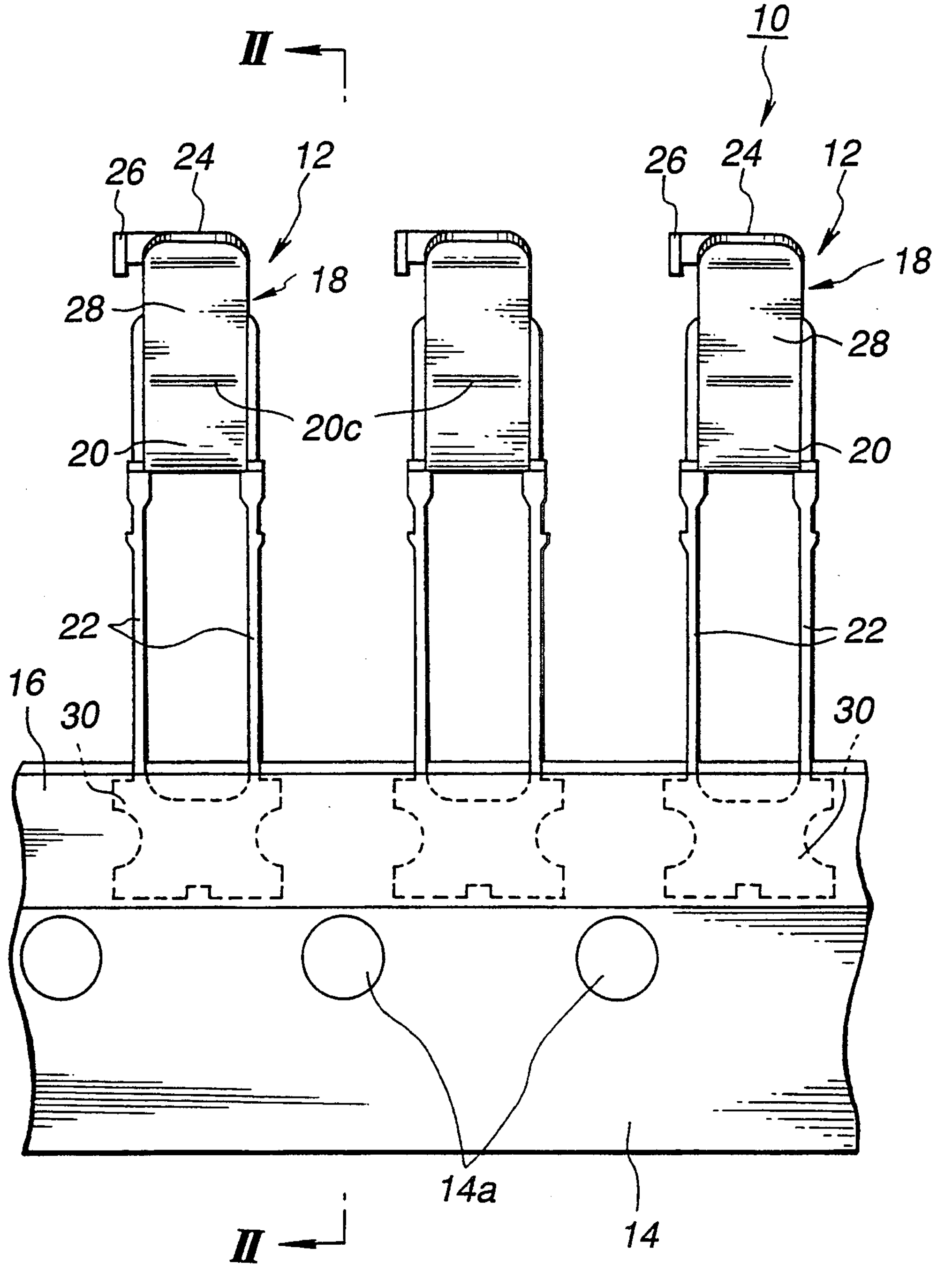
FIG. 1 is a front view of a tape-like assembly of fuse holding clips constructed in accordance with the invention.
Figure 2:
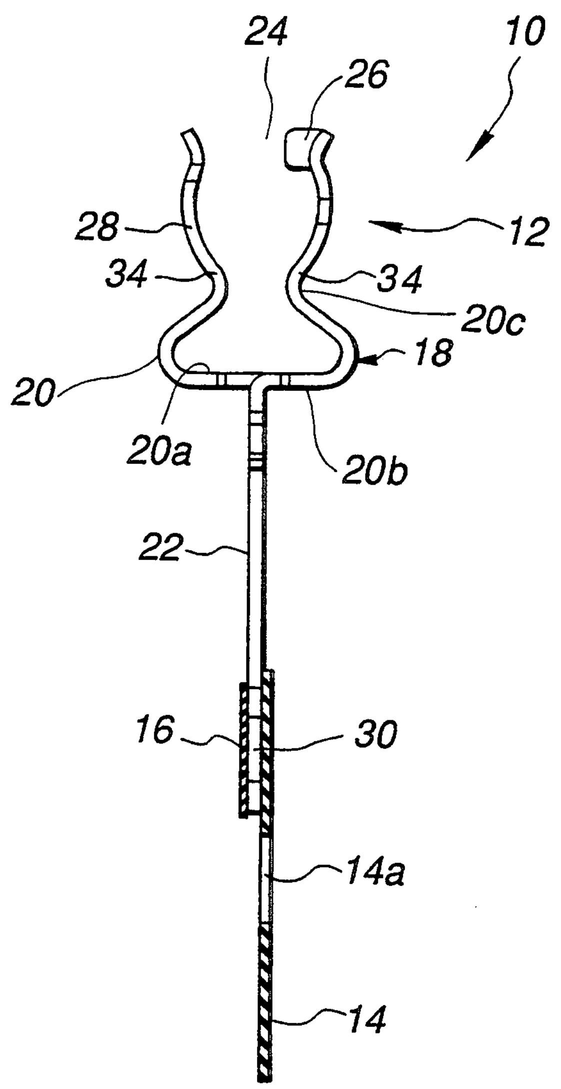
FIG. 2 is a cross sectional view of the tape-like assembly taken along the line II—II of FIG. 1.

Referring now to FIGS. 1 and 2, there is shown a tape or tape-like assembly 10 in the form of leading frame or taped parts comprising a plurality of fuse holding clips 12 for fuse holders which may be formed of electrically conducting metal such as copper, brass or copper alloy constructed in acordance with the invention and mechanically connected with each other in a spaced manner. In general, such an assembly is referred to as taped clips or clip tape.

In the illustrated embodiment, the clip tape 10 comprises a supporting tape portion 14 which may be of paper or plastic material and has a perforation including a plurality of holes 14*a* provided at a distance corresponding to a distance between adjacent teeth (feeding pitch) of a sprocket type feeder of an automatic part inserting machine not shown and an adhering tape portion 16 which may be of paper film and adheres the fuse holding clips 12 onto the supporting tape portion 14 so that the clips 12 are securely held between the supporting tape portion 14 and the adhering tape portion 16.

Figure 4:
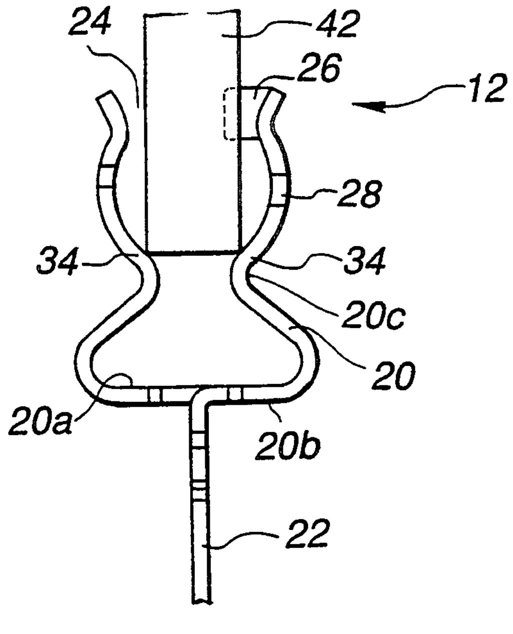
FIG. 4 is an enlarged front view of the fuse holding clip of the invention with mounting legs thereof being inserted through a not shown circuit board by the present invention.
Figure 5:
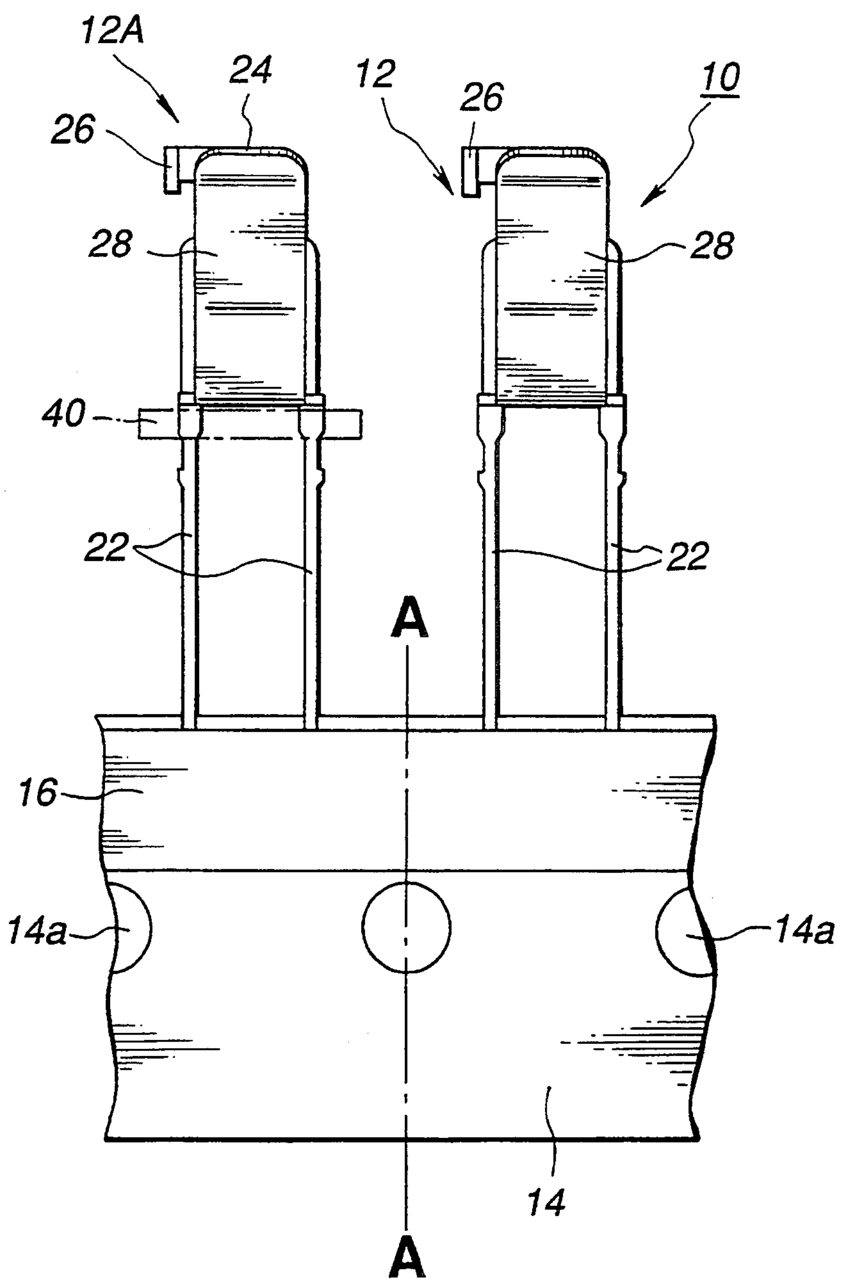
FIG. 5 is an enlarged front view of a portion of the tape-like assembly of FIG. 1 and illsutrates a position where the leading fuse holding clip is cut away from the tape-like clip assembly.

As shown in FIG. 4, each of the fuse holding clips 12 comprises a clip body 18 including a generally U-shaped curved piece 20 for resiliently holding a fuse thereon in a manner spaced from an inner bottom 20*a* thereof and mounting legs 22 integrally provided with the curved piece 20 to extend through mounting holes in a circuit board such as a printed circuit board, which will be described later with reference to FIGS. 10 and 11.

The mounting legs 22 are used to electrically and mechanically connect the fuse holding clips 12 to an electrically conducting layer of copper foil adhered to the circuit board in a predetermined pattern by a soldering layer which will be also described in detail later.

The U-shaped curved piece 20 has a base receiving opening 24 provided at upper edges thereof and serving to receive bases of a fuse such as a cartridge fuse therethrough. In the illustrated embodiment, the clip body 18 also has a base engaging tab 26 integrally provided with one of upper edges of the curved piece 20 and serving as a stop by engaging an end face of one of the fuse base ends so that the fuse is prevented from being removed out of the fuse holder which will be understood to be formed of two spaced fuse holding clips 12.

The U-shaped curved piece 20 also has a round portion 28 formed and sized to resiliently hold one of the bases of the fuse in a manner spaced from an inner bottom 20*a* of the curved piece 20. The round portion 28 is formed of narrowed strip portions 20*c* of the curved piece 20.

Returning to FIG. 1, each of the fuse holding clips 12 may also comprise a carrier portion 30 integrally provided with the mounting legs 22. It will be noted that the carrier portions 30 of the fuse holding clips 12 may be integrally formed with each other as shown in FIG. 3 so that they continue at their carrier portions 30 in the form of leading frame or clip strip 32.

Figure 3:
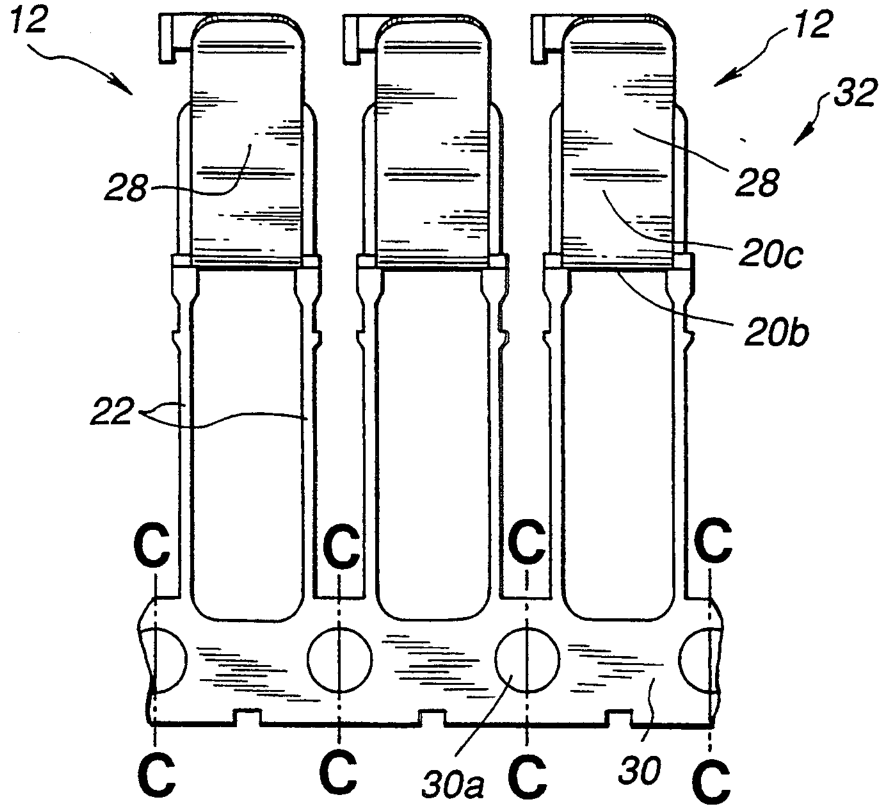
FIG. 3 is a front view of a plurality of fuse holding clips integrally formed by stamping and bending a strip of electrically conducting metal in the form of leading frame.

Each of the fuse holding clips 12 is separated by cutting the leading frame 32 of FIG. 3 along a line c—c at portions between the adjacent fuse holding clips 12 and held between the supporting tape portion 14 and the adhering tape portion 16 so that the tape-like clip assembly 10 is assembled.

It will be understood that the clip strip 32 in the form of leading frame with the fuse holding clips 12 intergrally formed at their carrier portions 30 can be easily formed by stamping and bending a metal strip such as copper alloy strip. As noted from FIG. 1, a distance between the adjacent fuse holding clips 12 is equal to that between the adjacent holes 14*a* of the perforation and each of the fuse hloding clips 12 is positioned just in the middle of the adjacent holes 14*a*.

It is because a space between the adjacent fuse holding clips of the tape-like clip assembly 10 is to be made equal to a space between the adjacent teeth of the sprocket type feeder that the clip strip 32 in the form of leading frame shown in FIG. 3 is separately cut into a plurality of fuse holding clips 12, which are thereafter held between the supporting tape portion 14 and the adhering tape portion 16 so that they are positioned at a distance different from that of the leading frame of FIG. 3. In FIG. 3, a numeral 30*a* designates holes in the leading frame 30 for feeding it by a feeding device such as sprocket.

It will be understood by those skilled in the art that the leading frame of FIG. 3 may be used as tape-like clip assembly 10, but it should be noted that in this case, the leading frame of FIG. 3 is required to have such a space between the adjacent fuse holding clips 12 and therefore between the adjacent holes 30*a* for the feeding perforation as is equal to the space between the adjacent teeth of the sprocket type feeder.

As shown in FIGS. 2 and 4, the U-shaped curved piece 20 further comprises a pair of pusher engaging portions 34 and 34 which is formed by further narrowing the round portion 28 at its lower end so that a pusher 42 of the automatic part inserting machine engages the round portion 28 on its lower faces which are to support a lower portion of the fuse. This causes the pusher to be positioned at relatively higher level without engaging the inner bottom 20*a* of the U-shaped curved pice 20.

More particlualy, if a width of the pusher 42 is so set as to have more than 3 mm, then a distance between the pusher engaging portions 34 and 34 may be so set as to have less than 3 mm. The distance between the pusher engaging portions 34 and 34 may be preferably so set as to be approximately 2.5 mm.

Thus, as shown in FIG. 4, the pusher 42 can pass the base receiving opening 24 to engage the pusher engaging portions 34 and 34 so that it can pushes the fuse clip 12 down. This enables the distance between the adjacent upper edges of the U-shaped curved piece 20 to be so set as to be large enough to allow the base of the fuse to smoothly passs therethrough. The distance between the upper edges may be preferably approximately 5 mm. This allows the fuse base having a relatively large outer diameter.

The fuse holding clips 12 can be mounted on the circuit boards 24 in a manner as described hereinjustbelow with reference to FIGS. 5 to FIG. 11.

The tape-like clip assembly 10 is fed by a sprocket type feeder to a predetermined operating position where the automatic part inserting machine is operated to mount the respective fuse hloding clips 12 on the corresponding circuit board 50. An inserting chuck 40 of the automatic part inserting machine not shown grasps the leading fuse holding clip 12A of the tape-like clip assembly 10 of FIG. 5 while a cutter (not shown) of the automatic part inserting machine cuts the supporting and adhering tape portions 14 and 16 along a line A—A of FIG. 5 so that the leading holding clip 12A is separated from the tape-like assembly 10.

Figure 6:
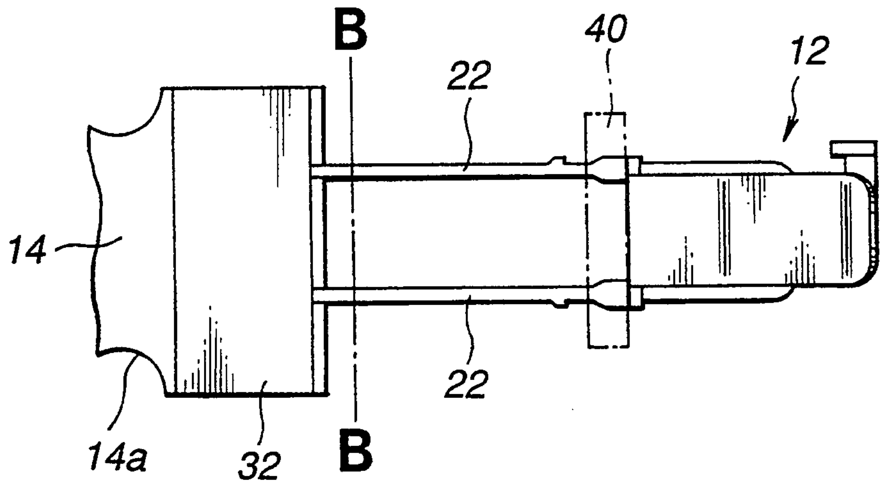
FIG. 6 is an enlarged front view of the thus cut leading fuse holding clip and illustrates mounting legs cut away from the tape portion and changed in its direction.

Thereafter, as shown in FIG. 6, the fuse clip 12A is moved down by the inserting chuck 40 so that the mounting legs 22 of the fuse clip 12A are directed in a horizontal manner and reach the cutter which is to cut the tape portions 14 and 16. At that position, the cutter cuts the mounting legs 22 at portions adjacent to the tape portions 14 and 16 along a line B—B of FIG. 6 so that the mounting legs 22 are removed away from the tape portions 14 and 16.

Figure 7:
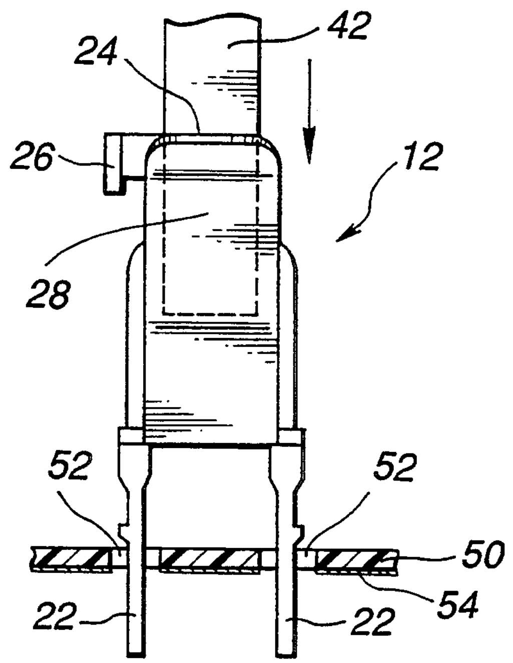
FIG. 7 is a side view of the fuse holding clip illustrated to be inserted into the circuit board by the present invention.
Figure 8:
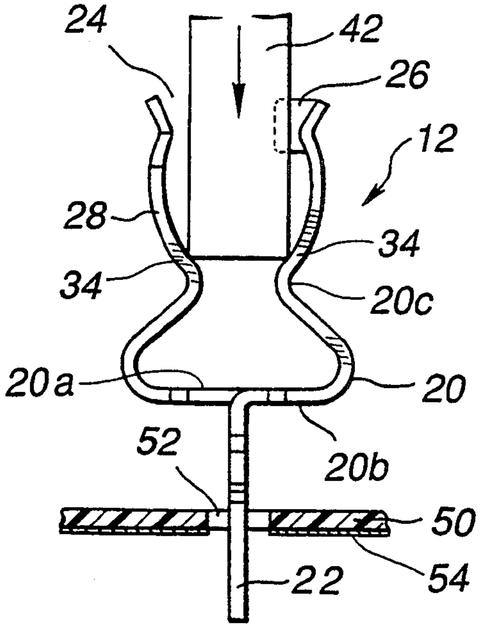
FIG. 8 is a front view of the fuse holding clip illustrated in the same manner as FIG. 7 illustrates it.

As shown in FIGS. 7 and 8, the thus separated fuse holding clip 12A is carried by the inserting chuck 40 above a position where the fuse holding clip 12A is to be mounted and at its mounting legs 22 inserted into mounting holes 52 in a circuit board 50 by the inserting chuck 40, which in turn releases the fuse holding clip 12A.

Thereafter, an inserting pusher 42 of the inserting machine is lowered through the base receiving opening 24 of the fuse holding clip 12A and engages and pushes down the pusher engaging portions 34 and 34 thereof until the outer bottom 20*b* of the U-shaped curved piece 20 engages the upper face of the circuit board 59.

As noted from FIGS. 7 and 8, the pusher is not required to engage the inner bottom 20*a* of the U-shaped curved piece 20, but positioned at a level higher than the level of the inner bottom. It will be noted that this allows the lower dead point of the pusher 42 of the automatic inserting machine to be maintained at high level. Thus, it will be also noted that the automatic part inserting machine for large sized radial parts can be used for the fuse holding clips as it is.

Figure 10:
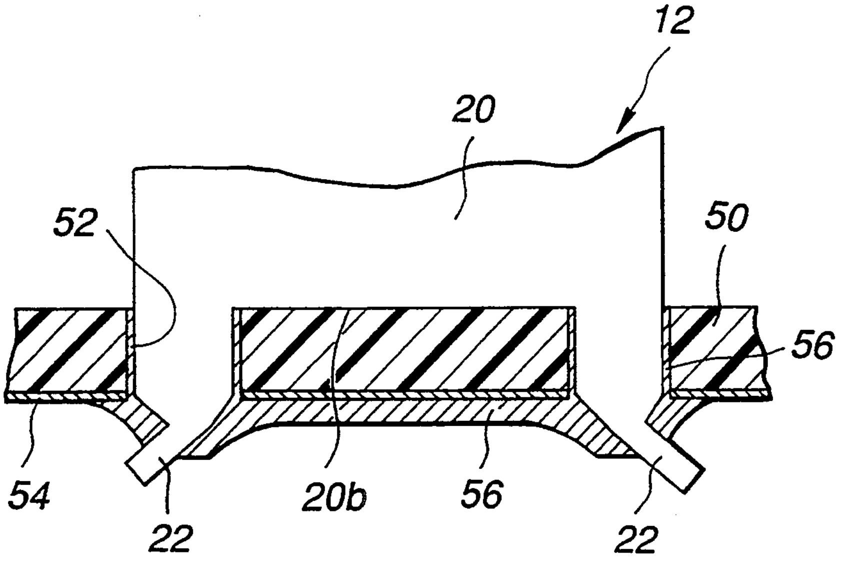
FIG. 10 is a front view of a portion of the fuse holding clip at its mounting legs soldered onto the circuit board.
Figure 11:
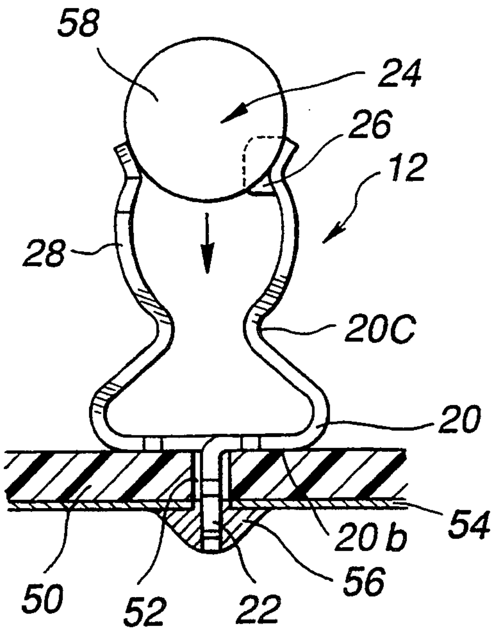
FIG. 11 is a front view of the fuse holding clip and illustrates a cartridge fuse inserted for being held therein.
Figure 12:
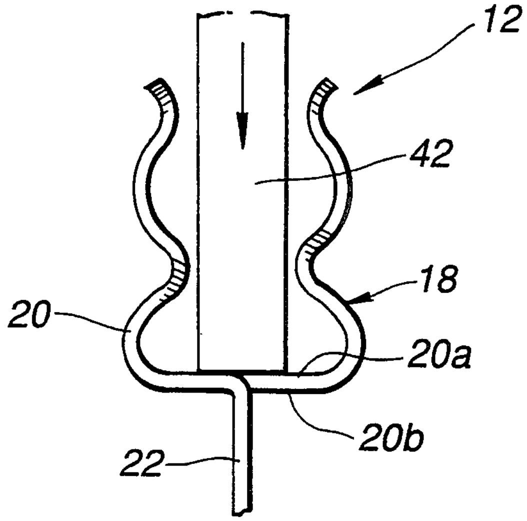
FIG. 12 (PRIOR ART)
FIG. 12 is a side elevational view of a prior art fuse holding clip pushed down by a pusher engaging an inner bottom of a fuse clip body.
Figure 13:
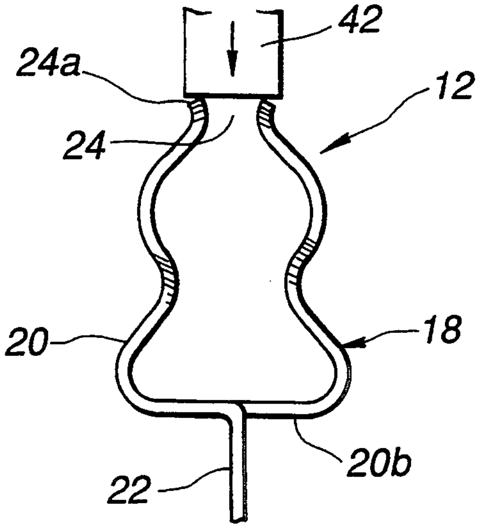
FIG. 13 (PRIOR ART)
FIG. 13 is a side elevational view of another prior art fuse holding pushed down by a pusher engaging upper edges of base receiving opening of a fuse clip body.

Thereafter, as shown in FIG. 10, a cutter and clincher (not shown) of the automatic part inserting machine cuts the mounting legs 22 of the fuse holding clip 12A at its portion just below the circuit board 50 on the lower face thereof and clinches the thus projected mounting legs 22 of the fuse holding clip 12A.

Figure 9:
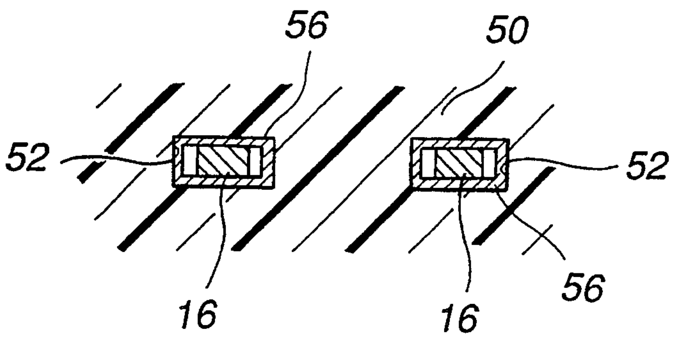
FIG. 9 is a horizontally cross-sectional view of the mounting legs extending through the circuit board.

Finally, the mounting legs 22 of the fuse holding clip 12A are soldered onto the electrically conducting layer 54 by an automatic soldering machine also not shown, so that the mounting legs 22 of the fuse holding clip 12A are electrically and mechanically connected to the electrically conduting layer 54. As shown in FIGS. 9 and 10, the solder 56 is filled around the mounting legs 22 in the holes 52.

The succeeding fuse holding clips 12 of the tape-like clip assembly 10 can be also mounted on the circuit board 24 at the respective corresponding position thereof in the same manner as desrcibed with respect to the leading fuse holding clip 12A.

A fuse holder is formed by spacing a pair of clips 12 to each other with the base engaging tabs 26 thereof symmetrically positioned so that the base engaging tab 26 of one of the spaced clips 12 is disposed opposite to that of the other clip 12.

A fuse 58 can be held by the fuse holder by inserting it through the base receiving openings 24 of the spaced fuse holding clips 12 and receiving the bases of the fuse onto the round portion 28 of the U-shaped curved piece 20 in a manner spaced from the inner bottom 20*a* thereof.

Since the base receiving openings 24 are never required to be narrowed, the fuse which has the bases of a relatively large outer diameter can smoothly pass through the base receiving openings 24.

Although a single embodiment of the invention has been described and illustrated with reference to the accompanying drawings, it will be understood by those skilled in the art that it is by way of example, and that various changes and modifications may be made without departing from the spirit and scope of the invention, which is defined only to the appended claims.

What is claimed is:

1. A method of mounting a fuse holding clip on a circuit board by an automatic inserting machine, said fuse holding clip comprising a fuse holding clip body including a generally U-shaped curved piece having upwardly extending, opposing side walls and mounting legs integrally provided with said clip body to extend through mounting holes in said circuit board, said method comprising the steps of engaging a leading edge of a pusher of said automatic part inserting machine onto at least partially upwardly facing pusher engaging means provided on inner faces of said side walls which are to support a lower portion of a fuse to be held by said fuse holding clip and pushing down said pusher until an outer bottom of said clip body engages an upper face of the circuit board.

2. The method of mounting the fuse holding clip on a circuit board as set forth in claim 1, and said pusher engaging means being provided on an inwardly projecting rounded portion of said side walls of said generally U-shaped curved piece for resiliently receiving said fuse at a location spaced from an inner bottom of said curved piece.

3. The method of mounting the fuse holding clip on a circuit board as set forth in claim 2, and said pusher engaging means being formed by narrowing said rounded portion which is to support said lower portion of said fuse.

4. The method of mounting the fuse holding clip on a circuit board as set forth in claim 1, and said pusher engaging the pusher engaging means at an inwardly bent portion of the clip body spaced from an inner bottom of the clip body.

5. The method of mounting the fuse holding clip on a circuit board as set forth in claim 1, wherein said pusher engages on a vertically intermediate part of said side walls.

* * * * *